(12) United States Patent
Rath et al.

(10) Patent No.: US 7,976,723 B2
(45) Date of Patent: Jul. 12, 2011

(54) METHOD FOR KINETICALLY CONTROLLED ETCHING OF COPPER

(75) Inventors: David L. Rath, Stormville, NY (US); Emanuel I. Cooper, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 1035 days.

(21) Appl. No.: 11/749,800

(22) Filed: May 17, 2007

(65) Prior Publication Data

US 2008/0286701 A1 Nov. 20, 2008

(51) Int. Cl.
*G03C 5/58* (2006.01)
*C09K 13/00* (2006.01)

(52) U.S. Cl. ........................ 252/79.1; 216/106

(58) Field of Classification Search .................. None
See application file for complete search history.

(56) References Cited

U.S. PATENT DOCUMENTS

| | | | | |
|---|---|---|---|---|
| 3,905,907 A * | 9/1975 | Shiga | ........................ | 252/79.4 |
| 5,200,166 A * | 4/1993 | Shiga et al. | ................ | 423/584 |
| 5,211,927 A * | 5/1993 | Itani et al. | .................. | 423/272 |
| 6,191,085 B1 * | 2/2001 | Cooper et al. | ............ | 510/175 |
| 6,440,856 B1 * | 8/2002 | Bessho et al. | ............ | 438/691 |
| 6,451,064 B1 * | 9/2002 | Del Duca et al. | ............ | 8/137 |
| 6,495,501 B1 * | 12/2002 | Del Duca et al. | ............ | 510/283 |
| 6,514,866 B2 * | 2/2003 | Russell et al. | ............ | 438/712 |
| 6,599,370 B2 * | 7/2003 | Skee | .............................. | 134/3 |
| 6,645,872 B2 * | 11/2003 | Russell et al. | ............ | 438/712 |
| 6,740,589 B2 * | 5/2004 | Shimazu et al. | ............ | 438/691 |
| 6,821,309 B2 * | 11/2004 | Singh et al. | .................... | 51/307 |
| 7,247,558 B2 * | 7/2007 | Basol et al. | .................. | 438/633 |
| 7,354,530 B2 * | 4/2008 | Wang et al. | .................. | 252/79.1 |
| 7,671,001 B2 * | 3/2010 | Skee | ........................... | 510/175 |
| 2002/0077259 A1 * | 6/2002 | Skee | ........................... | 510/175 |
| 2003/0095917 A1 * | 5/2003 | Wilcox et al. | ................ | 423/584 |
| 2003/0159362 A1 * | 8/2003 | Singh et al. | .................... | 51/293 |
| 2004/0055095 A1 * | 3/2004 | McKelvey et al. | ............... | 8/405 |
| 2004/0068782 A1 * | 4/2004 | Butter-Jentsch et al. | ........ | 4/231 |
| 2004/0224511 A1 * | 11/2004 | Pillion et al. | ................ | 438/689 |
| 2005/0090104 A1 * | 4/2005 | Yang et al. | .................... | 438/689 |
| 2005/0098538 A1 * | 5/2005 | Ding et al. | ........................ | 216/83 |
| 2005/0175798 A1 * | 8/2005 | Kurokawa et al. | ........... | 428/34.1 |
| 2006/0121725 A1 * | 6/2006 | Basol et al. | .................... | 438/626 |
| 2006/0175295 A1 * | 8/2006 | Chu et al. | ......................... | 216/88 |
| 2007/0060490 A1 * | 3/2007 | Skee | ............................. | 510/175 |
| 2007/0084828 A1 * | 4/2007 | Yoneda et al. | .................. | 216/88 |
| 2008/0254629 A1 * | 10/2008 | Chang et al. | .................. | 438/693 |
| 2008/0286701 A1 * | 11/2008 | Rath et al. | ...................... | 430/329 |
| 2009/0120457 A1 * | 5/2009 | Naghshineh et al. | ............. | 134/2 |
| 2009/0215269 A1 * | 8/2009 | Boggs et al. | .................. | 438/693 |
| 2009/0215658 A1 * | 8/2009 | Minsek et al. | ................. | 510/175 |
| 2010/0015805 A1 | 1/2010 | Mayer et al. | | |

* cited by examiner

*Primary Examiner* — Allan Olsen
(74) *Attorney, Agent, or Firm* — Connolly Bove Lodge & Hutz LLP; Louis J. Percello, Esq.

(57) ABSTRACT

An etching composition, particularly for kinetically controlled etching of copper and copper alloy surfaces; a process for etching copper and copper alloys, particularly for etching at high rates to provide uniform and smooth, isotropic surfaces; an etched copper or copper alloy surface obtained by the process; and a process for generating copper or copper alloy electrical interconnects or contact pads. The etching composition and etching processes provide a smooth, isotropic fast etch of copper and copper alloys for semiconductor fabrication and packaging.

21 Claims, 9 Drawing Sheets

METHOD FOR KINETICALLY CONTROLLED ETCHING OF COPPER

BACKGROUND

1. Technical Field

The disclosure relates to an etching composition, particularly for a kinetically controlled etching of copper and copper alloy surfaces. The disclosure also relates to a process for etching copper and copper alloys, particularly etching at high rates to provide uniform and smooth, isotropic surfaces. The disclosure also relates to an etched copper or copper alloy surface obtained by the process, and a process for generating copper or copper alloy electrical interconnects or contact pads.

2. Discussion of the Background

In the fabrication of thin film wiring for electronic applications and capture pads for interconnections, it is often required to remove a pre-defined thickness of polycrystalline copper by etching. Uniform copper removal may also be accomplished by CMP (chemical mechanical polishing) or e-CMP (electrochemical-mechanical polishing), often with much higher removal rates. Chemical etching, however, has the advantages of process simplicity and absence of mechanical interaction with the substrate. The latter advantage is becoming more important as the mechanical strength of the underlying dielectric layers is being compromised in the pursuit of lower dielectric constants. Any anisotropic etching of the copper or roughening of the copper surface may significantly degrade the performance or reliability of the electronic device.

Generally, etchants (etching compositions or solutions) are either intrinsically anisotropic, or have low etch rates that cannot easily meet manufacturing throughput requirements. In particular, acidic etchants tend to preferentially etch copper in the immediate proximity of grain boundaries and have specificity to grain orientation. Smooth etchants of copper, as disclosed in U.S. Pat. No. 7,056,648 to Cooper et al., may etch at low rates, a fact that limits their use to applications where only small amounts of copper must be etched. In addition, such etchants form a stable oxidized layer, the removal of which requires the use of a post-etch clean as an extra manufacturing step.

Numerous applications in semiconductor fabrication and packaging would benefit from a process able to provide a smooth, isotropic fast etch of copper and copper alloys. Some examples of applications that would benefit include the following:

(1) Selective capping on recessed copper wiring in advanced CMOS (complementary metal oxide semiconductor) devices—to decrease the effective dielectric constant of the intra-layer insulator and increase the reliability of copper wires with regard to stress migration and electromigration;

(2) Post-CMP clean for copper Dual Damascene builds—to suppress dendrite growth for increased reliability, and to remove copper residues on the dielectric spacers for decreased current leakage and increased shorts yield;

(3) Reduced contact resistance between Dual Damascene build levels—to increase contact area at base of vias with upper-level, high resistance liners; and (4) Isotropic etching of BLM (ball limiting metallurgy) structures for semiconductor interconnects—to remove copper from open areas between capture pads without undue undercutting of patterned interconnects.

Accordingly, a need exists for providing a copper etchant and process for isotropic etching copper and copper alloys at high rates, which are especially useful for improving semiconductor fabrication and packaging.

SUMMARY

The present disclosure addresses problems and expands the applications in the prior art and provides an etching composition and processes that are capable of isotropic etching copper and copper alloys at high rates to produce smooth copper and copper alloy surfaces.

In particular, one aspect of the disclosure is an etching composition, comprising:

(a) one or more bidentate or tridentate copper complexants selected from the group consisting of aminocarboxylic acids (amino acids), aminophosphonic acids, di- and tricarboxylic acids, di- and triphosphonic acids, carboxyphosphonic acids, and combinations thereof, (b) a compound containing one or more peroxy groups;

(c) optionally one or more buffering compounds;

(d) optionally a peroxide stabilizer; and (e) water.

The etching composition is buffered to a pH ranging from about 5 to about 9, which allows for the formation of a surface-kinetic-limited etch for the removal of copper or a copper alloy in the etching process described below.

Another aspect of the disclosure relates to a method of kinetically controlled etching of copper or copper alloys comprising:

(a) preparing a composition according to claim 1;

(b) exposing a copper or copper alloy containing substrate to the composition at a temperature between about 0° C. to about 70° C., with optional stirring or flow, to remove the copper or copper alloy;

(d) removing the substrate when the copper or copper alloy has been dissolved;

(e) rinsing the substrate with deionized water and/or an alcohol; and (f) drying in a stream of inert gas.

A remarkable feature of the etching process is that the etching rate is only weakly dependent on flow conditions near the substrate surface. Consequently, as described in more detail below, a wide range of flow rates corresponds to only small variations in the etch rate. The practical significance of this finding is that simple, inexpensive processing conditions may be used. For instance, many wafers may be processed at once in the same tool.

Still another aspect of the disclosure is also concerned with an etched copper or copper alloy surface obtained by the above-described process.

A further aspect of the disclosure is concerned with a process for generating copper or copper alloy electrical interconnects or contact pads, which comprises:

(a) depositing a blanket copper or copper alloy film on a dielectric substrate;

(b) depositing a thin film of photoresist over the copper or copper alloy film;

(c) exposing and developing the photoresist through a mask designed to generate the negative image of the desired copper or copper alloy pattern;

(d) etching away the copper or copper alloy exposed in (c) by the above-described process; and (e) stripping the resist to reveal a desired copper or copper alloy pattern.

The above aspects highlight certain embodiments of the etching composition and isotropic etching. However, additional aspects and advantages will be become readily apparent by those skilled in the art by the following description of the drawings and detailed description of the disclosure.

BEST AND VARIOUS MODES FOR CARRYING OUT THE DISCLOSURE

A more complete appreciation of the disclosure and many of the attendant advantages will be readily obtained, as the same becomes better understood by reference to the following detailed description when considered in connection with the accompanying drawings.

The etching composition of the disclosure may generally include a wide variety of complexants, in which the active groups toward Cu are amino, carboxylate and/or phosphonate, positioned in such a way that, in the complex, the copper atom, the metal-bonding atoms—N or O—and the carbon atoms linking the latter form a 5, 6 or 7-member ring, as is usually the case for chelating compounds. The preferred complexants are amino acid complexants. Example complexants and resulting etch rates (ER) (at room temperature and pH 5.9, with 0.1 M complexant and 1M $H_2O_2$) are tabulated in the following Table.

TABLE

| Complexant | ER (nm/min) |
| --- | --- |
| glycine | 100 |
| alanine | 50 |
| 2-aminobutyric | 40 |
| norvaline | 20 |

It is noted that the etch rates may range from about 10 nm/min to 200 nm/min. The etch rates are a strong function of the alkyl chain size in this series of alpha amino acids containing respectively 2, 3, 4, and 5 carbon atoms, even though their complexation constants with copper are nearly identical.

In agreement with a Koutecky-Levich analysis, described below, the rate differences are much too large to be due to a decrease of diffusion rates with increased molecular size. They are more likely to be related to rates of adsorption and/or desorption of the amino acids and/or their copper complexes from the oxidized surface layer. The non-adsorbing portions of the amino acid molecules inhibit the access of additional molecules of the same type to the surface, through steric hindrance. In addition, effective complexation by simple amino acids (or dicarboxylic or diphosphonic acids etc.) requires more than one ligand per Cu ion. Thus, the larger the amino acid molecule, the lower the etch rate.

It is noted that the Koutecky-Levich relation delineates surface kinetics from mass transport (or diffusion) in a surface reaction. See "Electrochemical Methods, Fundamentals and Applications", by A. J. Bard and L. R. Faulkner, $2^{nd}$ edition p. 341. In particular, for chemical etching of Cu, the etch rate (ER) relation may be written as $$1/ER = 1/ER_k + 1/ER_D \quad (eq. 1)$$

where $ER_k$ is etch rate dependence on surface reaction kinetics, and $ER_D$ is etch rate dependence on diffusion (or mass transport) of the rate limiting reactant or product in etching copper. For diffusion limited etching of a rotating disk electrode (RDE), the etch rate may be written as $$ER_D = 0.62 D_x^{2/3} \mu^{-1/6} \omega^{1/2} \theta_{Cu}^{-1} c_x \quad (eq. 2)$$

where $\omega$ is the RDE angular speed, $D_x$ is the diffusion coefficient of diffusion limited species, $c_x$ is the concentration of the diffusion limited species, $\mu_{(4)}$ is the kinematic viscosity of the etchant, and $\theta_{Cu}$ is the molar density of copper metal. Rewriting Eq. 1, the functional dependence of the Cu etch rate is $$1/ER = 1/ER_k + 1.61 D_x^{-2/3} \mu^{1/6} \omega^{-1/2} \theta_{Cu} c_x^{-1} \quad (eq. 3)$$

Figure 4:
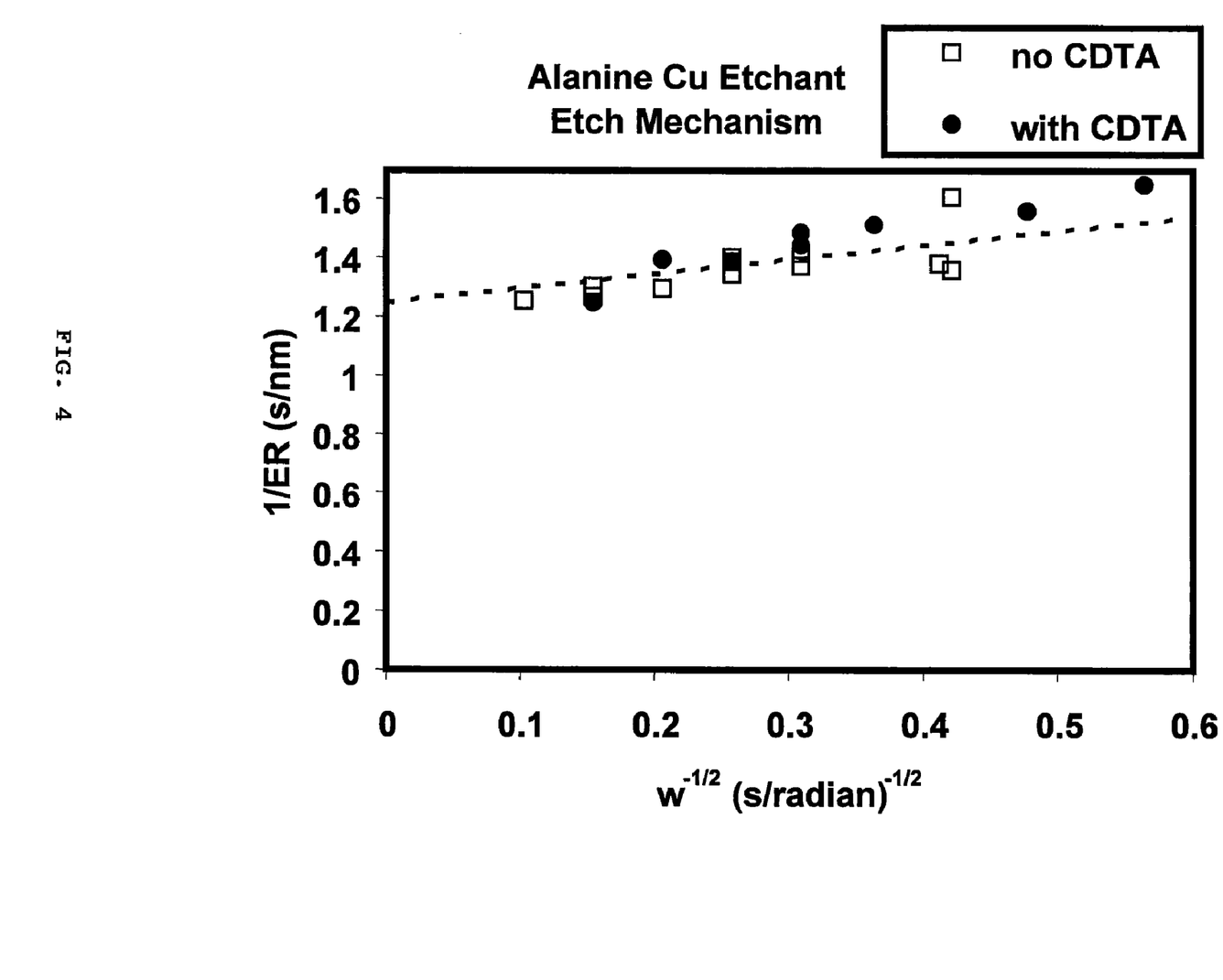
FIG. 4 illustrates a plot of a Koutecky-Levich relation for copper etching.

When the effect of multidentate chelators, such as ethylene diamine tetraacetic acid (EDTA) and cyclohexane diaminetetraacetic acid (CDTA) (6 complexing groups per molecule), is examined, it is found that they are much less effective etchants compared with simple amino acids; this is despite their higher complexation constants with Cu(2+) when compared with the cumulative complexations of simple (bidentate) amino acids with Cu(2+). For example, the plot in FIG. 4 shows that the added CDTA stabilizer has little kinetic effect (and that effect, if any, is to decrease the etch rate), despite the fact that CDTA is a much stronger Cu(2+) complexant than alanine. This unexpected observation is likely due to a combination of multidentate complexant molecular size and stiffness, both of which inhibit the reactivity with surface atoms when compared with a combination of two or three smaller molecules of bidentate complexant. Conversely, compared to an ion in solution, an ion on the surface of the oxide or hydroxide precipitate has fewer of its coordination positions accessible to complexant molecules, thus minimizing the potential advantage of a multidentate complexant such as hexadentate CDTA in what is likely the slow (kinetically controlling) reaction step. A possible additional factor may be that, once adsorbed, a multidentate complexant is slower to desorb from the surface.

It is noted that other complexants beside amino acids may be used, provided that they have a cumulative complexation constant with Cu(2+) high enough to prevent formation of stable hydroxide precipitate, and a conditional (or "effective") cumulative complex stability constant of at least about $10^5$ at the process pH. The conditional stability constant is derived from the nominal stability constant by accounting for the effect of pH on complex stability; this effect is due to modification of the concentration of the actively complexing deprotonated species.

Specifically, a conditional stability constant is obtained by dividing the normal stability constant of a complex MZ formed by an acid $H_jZ$ by a coefficient $\alpha_{z(H)}$ defined—through the successive protonation constants $K_iZ$—as follows:

$$\alpha_{z(H)}=1+[H]\cdot K_{HZ}+[H]^2\cdot K_{HZ}\cdot K_{H2Z}+ \quad \ldots \quad + [H]^j\cdot K_{HZ}\cdot K_{H2Z}\cdot \ldots \cdot K_{HjZ} \quad \text{(eq. 4)}$$

A further discussion of conditional complexation constants may be found, e.g., in "Complexometric Titrations" by G. Schwarzenbach and H. Flaschka, $2^{nd}$ English edition, Methuen 1969. Classes of suitable complexants include but are not limited to dicarboxylic and tricarboxylic acids (for examples, malonic and citric acids, respectively) and diphosphonic and triphosphonic acids (e.g. 1-hydroxyethane-1,1-diphosphonic acid, HEDP), as well as aminophosphonic and mixed phosphonic-carboxylic acids, combinations of these complexants.

Figure 6:
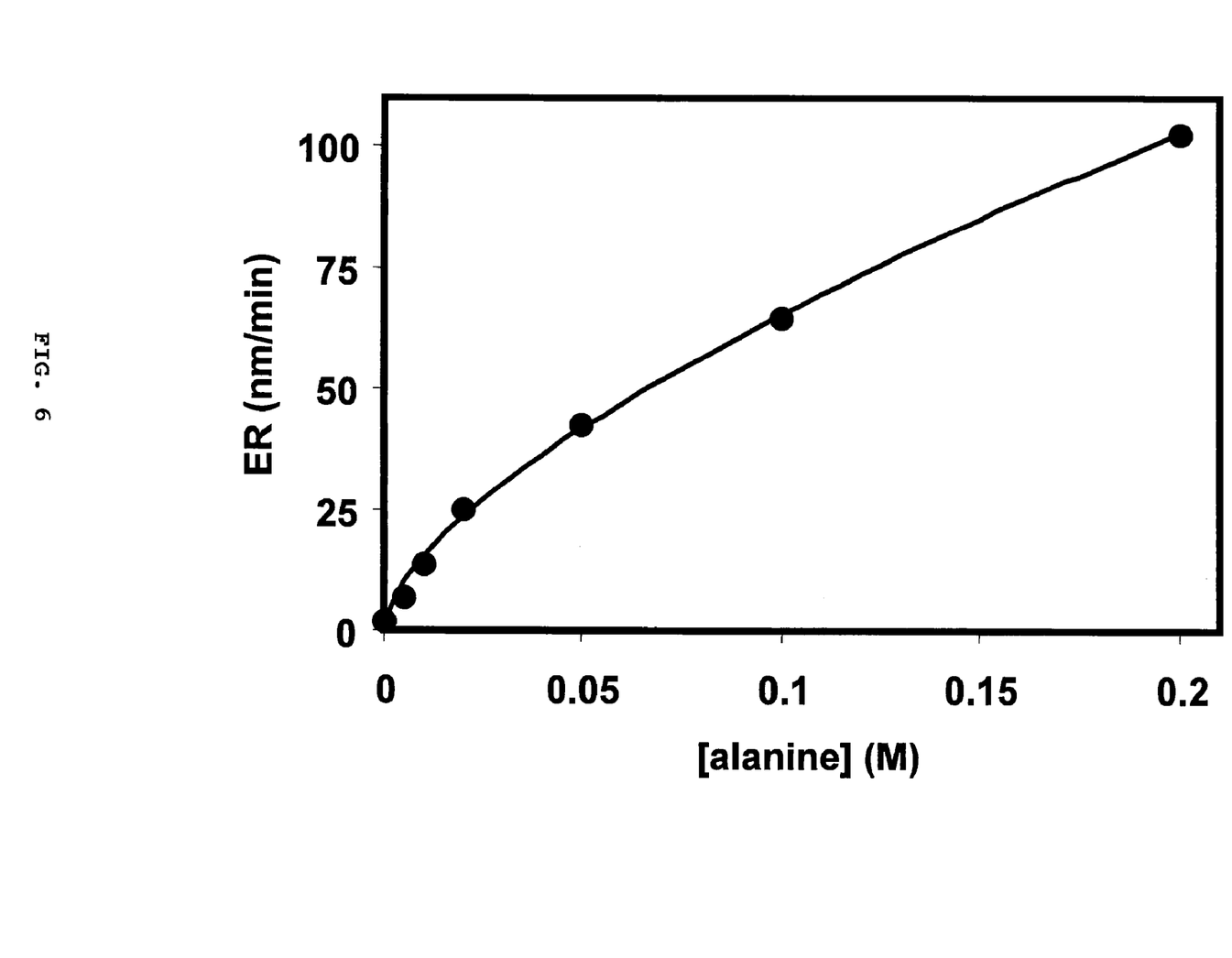
FIG. 6 illustrates a plot of the etch rate of copper as a function of molar concentration of alanine in an etchant.

The etching complexant includes, but is not limited to, the above suitable complexants, e.g., a bidentate or tridentate complexant, which acts toward copper ions through its amino, carboxylate and/or phosphonate groups. The complexant generally has a cumulative stability constant with copper between about $10^8$ and about $10^{16}$. In this class, simple amino acids are particularly preferable, being non-toxic and biodegradable as well as offering a wide range of etching rates as seen above, sufficient water solubility in neutral to basic solutions, and short-term stability against oxidation. Examples of preferred etching complexants for copper and copper alloys include but are not limited to alanine, glycine, 2-aminobutyric acid, and combinations thereof The molar concentration of the etching complexants is about 0.01 to about 0.5 M, and preferably about 0.05 to about 0.2 M. A general plot of etch rate as function of etchant concentration is shown in FIG. 6.

Figure 5:
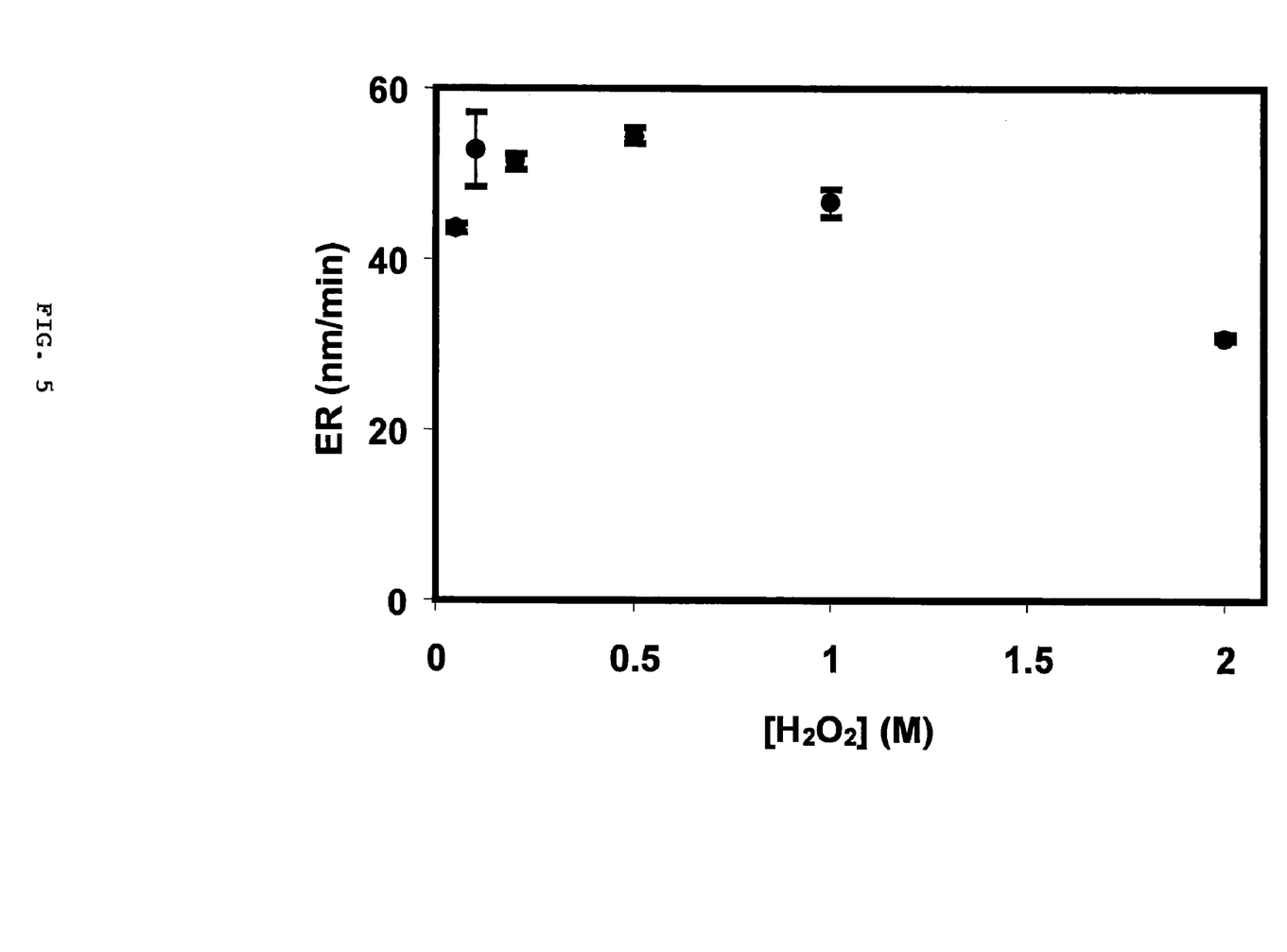
FIG. 5 illustrates a plot of the etch rate of copper as a function of molar concentration of hydrogen peroxide in an etchant.

Suitable peroxy containing compounds (oxidants) include but are not limited to hydrogen peroxide, other compounds that contain a peroxide component (perborate salts, percarbonate salts, etc.), and other strong oxidants capable of oxidizing the copper surface instantaneously and quantitatively (e.g., an urea-hydrogen peroxide complex). Hydrogen peroxide is a preferred oxidant, since it is a volatile liquid easily rinsed that leaves no residues. The concentration of oxidant is about 0.02 M to about 4 M, and preferably about 0.2 M to about 1 M. When alanine is the etching complexant and hydrogen peroxide is the oxidant, it is observed, as shown in FIG. 5, that the etch rate is a weak function of the latter's concentration, with a maximum at about 0.5 M (1.7%) $H_2O_2$.

The optional strong complexant, used as a bath stabilizer (optional peroxide stabilizer), generally acts through four or more chelating groups and has a cumulative complex stability constant with copper of $>10^{16}$. The preferred optional strong complexants are CDTA and diethylenetriaminepenta(methylenephosphonic) (DTPMP) acid due to their stability against oxidation by peroxides. The amount of strong complexant added is generally more than the molar concentration of copper (or total transition metals including copper) expected to accumulate during the bath life of the etchant.

It is noted that the strong complexant stabilizer such as CDTA, is not needed when etching only a few wafers and it has no apparent influence on the copper quality or etch rate, but it does help prevent undue peroxide decomposition. A single pass etch does not require CDTA, but an etching bath that is used for a long period of time or with high volume of parts benefits by having an excess of CDTA or similar strong complexant over the molar amount of accumulated metal ions.

Figure 7:
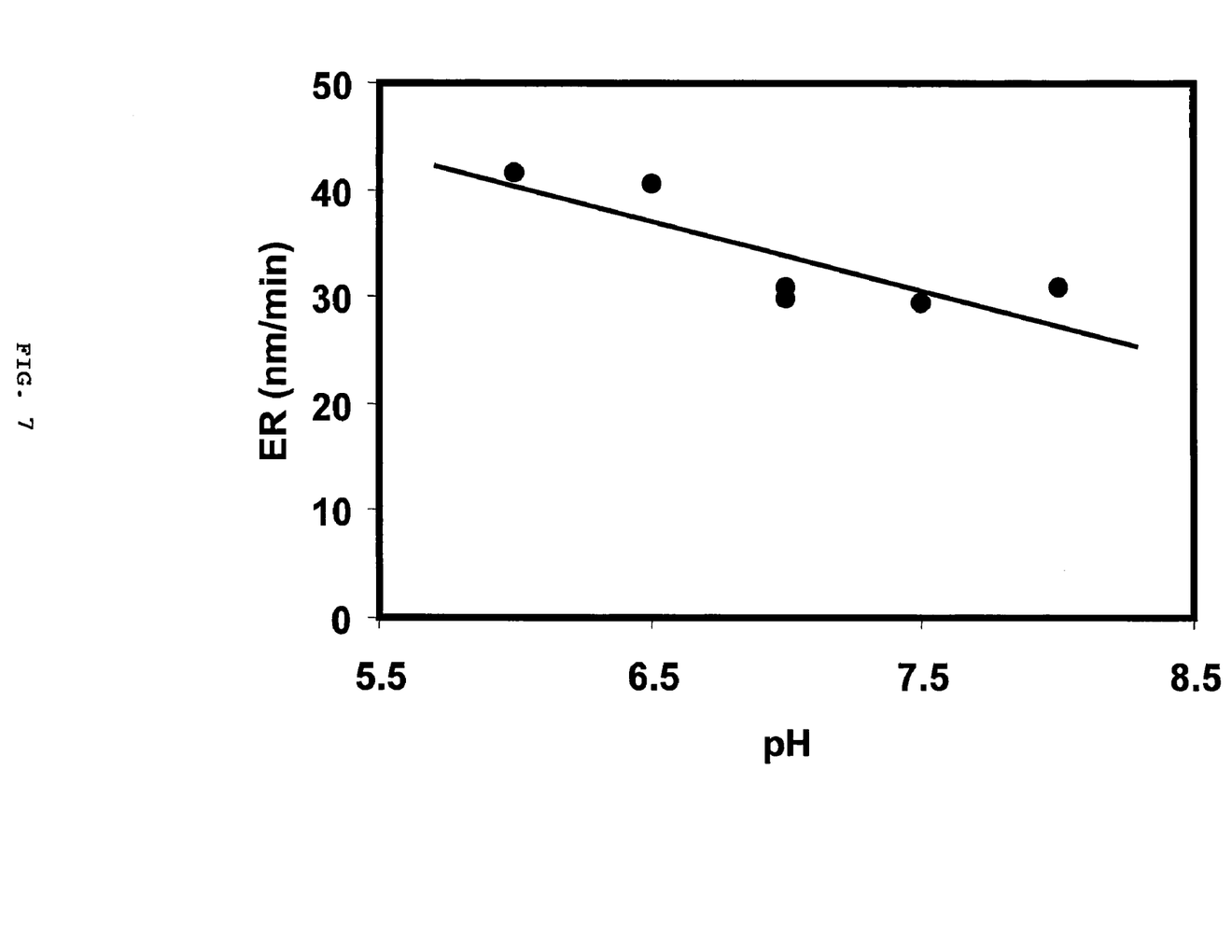
FIG. 7 illustrates a plot of the etch rate of copper as a function of pH.

The etching composition has a pH of about 5 to about 9, and preferably of about 6 to about 8. The etch rate is dependent on pH, with ER(pH 5)~2ER(pH 9), as shown in FIG. 7. At pH≦5, the etching process becomes less kinetics-controlled and more acid-like (less isotropic). The pH may be adjusted to the desired level by adding a non-oxidizing acidic or basic compound such as phosphoric acid or KOH, respectively.

The preferred pH buffers for the about 5 to about 9 pH range are based on phosphates. When operating at a pH at above 8 or above, using an amino acid complexant often eliminates the need for an added buffer, since most amino acids are buffers in the pH range of about 8 to about 10. When operating in the pH range of about 6 to about 8, using a phosphonic acid complexant may likewise eliminate the need for an added buffer since most phosphonic acids are buffers in that range. When using a phosphate buffer, it may consist of a mixture of $H_3PO_4$ and $K_3PO_4$ or equivalent to maintain the pH in the range of about 5 to about 9. The molar concentration of total phosphate is about 0.005 to about 0.1 M, and preferably about 0.01 to about 0.03 M.

Examples

The following non-limiting examples are presented to further illustrate the etchants and etching processes of the disclosure.

Etchant A

An etchant was prepared containing the following: 0.05 molar (M) alanine, 1.0 M hydrogen peroxide, 0.02 M phosphate buffer at pH 7.44, and 0.05 wt % CDTA. A 200 mm patterned wafer of a CMOS structure was etched in a rotating single-wafer immersion tool with rotation rate of 50 rpm.

Figure 1:
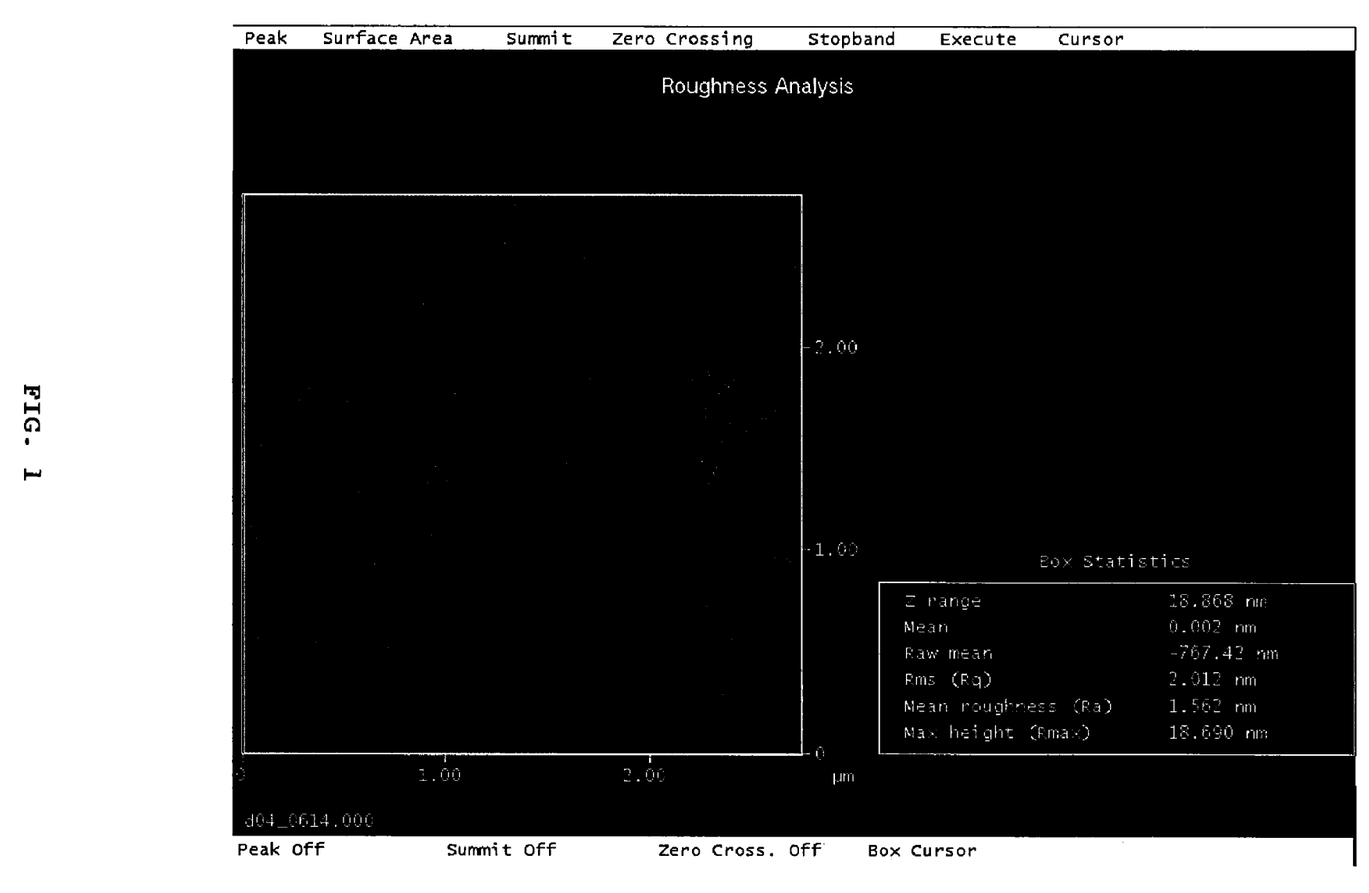
FIG. 1 illustrates an atomic force microscope (AFM) image of a copper surface after 100 nm etch of patterned CMOS structure.

An atomic force microscope (AFM) image of the copper (Cu) surface after a 100 nm etch of the patterned CMOS structure is shown in FIG. 1. The copper surface roughness before etching was about 1 nm RMS, and after 100 nm etch was about 2 nm RMS.

Figure 2:
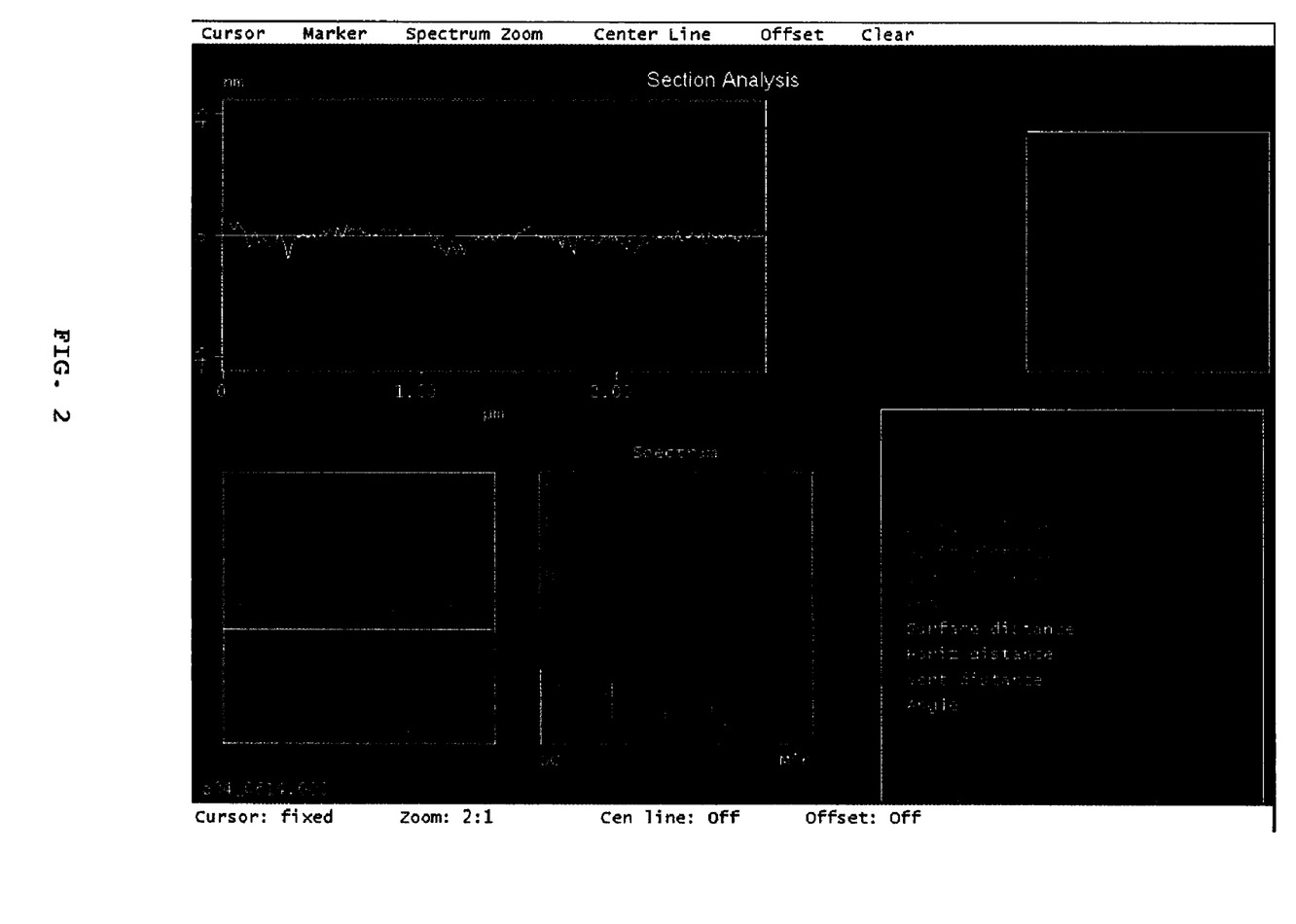
FIG. 2 illustrates an AFM line scan of etched copper of FIG. 1.

FIG. 2 shows an AFM line scan of the etched Cu of FIG. 1. In particular, the image shows maximum Cu height difference of about 6 nm across grains after 100 nm etch of the patterned CMOS structure.

Figure 3:
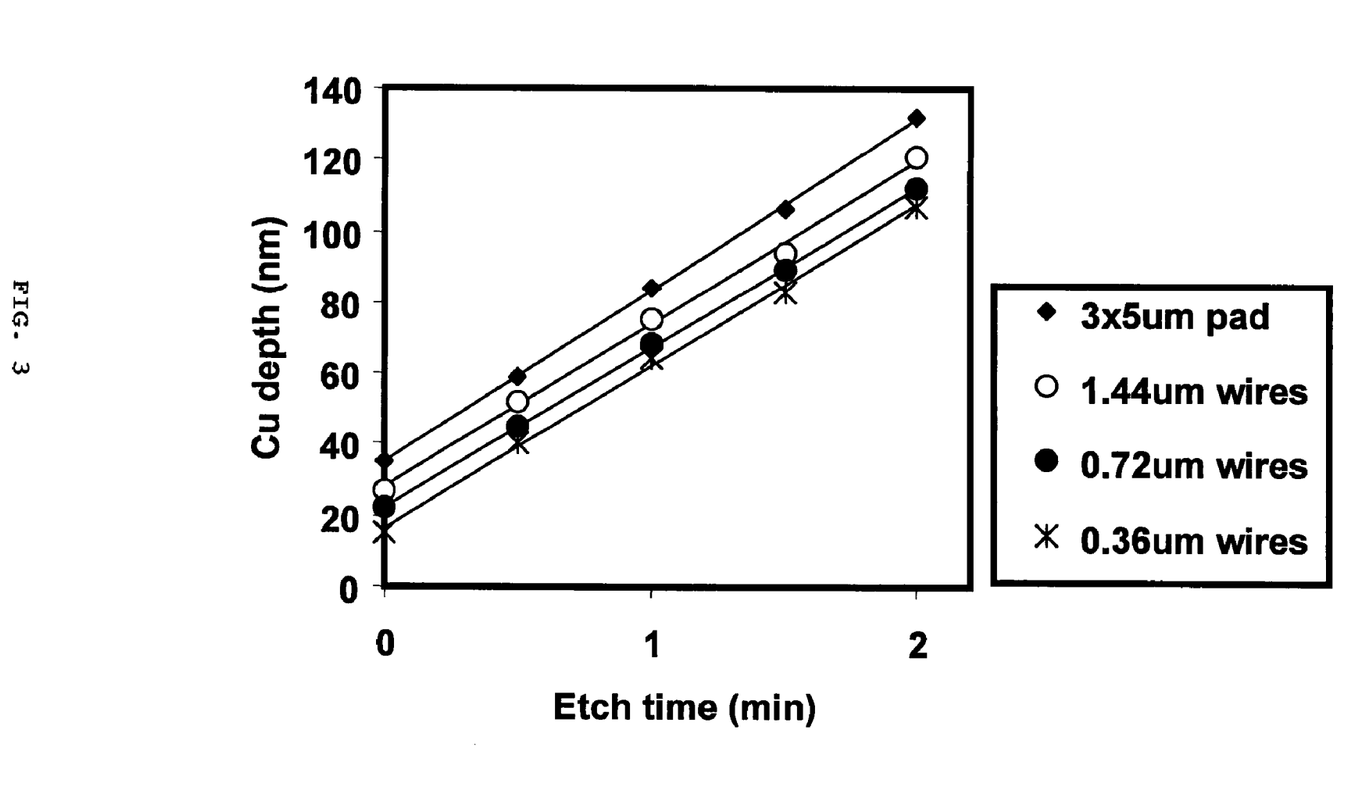
FIG. 3 illustrates a plot of AFM-measured copper depths after timed etches of patterned CMOS wafers.

FIG. 3 shows a plot of AFM-measured Cu depths after timed etches of patterned CMOS wafers. In particular, the features measured were 3×5 µm isolated pads, and nested Cu wires with wire widths equal to dielectric spacer widths. The non-zero intercepts with no etch were initial Cu depths from pattern dependent cooper recessing by CMP. Etchant A and etching tool from FIG. 1 were the same.

Etchant B

An etchant was prepared containing the following: 0.05 M alanine, 1.0 M hydrogen peroxide, 0.02 M phosphate buffer with pH 7.0, and with and without 0.05 wt % CDTA. Etch rates with the etchant were determined from sheet resistance measurements of annealed, electroplated Cu.

A plot of a Koutecky-Levich relation—reciprocal etch rate as a function of reciprocal square root of rotation speed—for Cu etching by the etchant, with and without CDTA, is shown in FIG. 4.

Analysis of the plot in FIG. 4 shows that the etch rate is dominated by surface kinetics (large intercept), with only small dependence on rotation speed and, therefore, on diffusion of rate-limiting etch reactant or product (flat slope). The slope of the included straight line is calculated for alanine diffusion-limited reaction using literature values. Etchants that show these features may deliver better uniformity of etch depths on patterned structures, and also across large substrates, with little dependence on flow patterns across the substrate surfaces. This behavior makes the disclosed etchants particularly suitable for the 300 mm wafers which are becoming the leading substrates for the electronic industry. Furthermore, the small effect of changes in agitation means that many wafers may be treated in one step (with the solution flowing between and around them), an advantage over single-wafer processes.

It is noted that a plot of the inverse of the total etch rate versus the inverse square-root of the rotation rate of a RDE will yield a straight line in which the slope reflects diffusion limitations and the intercept is related to limitations in surface kinetics. For Cu etching in the disclosed etchant, the large intercept and near flat slope shows that the etching reaction is dominated by surface kinetics. Etchants that are surface-kinetics controlled are particularly well suited to attain uniform etching of patterned Cu substrates. Furthermore, the etchant lack of sensitivity to CDTA in the solution shows that CDTA does not partake in the surface reaction significantly and is primarily present to stabilize hydrogen peroxide in the bulk of the solution.

The use of a combination of a strong oxidizer and an etching complexant in a near neutral pH environment causes the etch to proceed through a nearly instantaneous surface oxidation step which, in effect, coats the Cu surface with Cu oxide or hydroxide. Differences of energy between surface Cu atoms (due to energy differences between crystallographic faces, surface defects etc.) are effectively eliminated by this means. The result is a kinetically controlled etch, which is non-roughening and isotropic. The rate of dissolution observed is effectively the rate of Cu oxide (or hydroxide) dissolution by the etching complexant.

Etchant C

Etchants were prepared containing the following: 0.05 M alanine, 0.02 M phosphate buffer with pH 7, 0.05 wt % CDTA, and with varying amounts of hydrogen peroxide. Annealed, electroplated Cu samples were etched in the etchants at room temperature, in a beaker with reverse magnetic stirrer agitation with maximum rotation speed of 1200 rpm. Etch rates with the etchants were determined from sheet resistance measurements. A plot of the etch rate of Cu as a function of molar concentration of hydrogen peroxide is shown in FIG. 5.

Etchant D

Etchants were prepared containing the following: 1.0 M hydrogen peroxide, 0.02 M phosphate buffer with pH 7.0, 0.05 wt % CDTA, and with varying amounts of alanine, at room temperature. Annealed, electroplated Cu samples were etched in the etchants with reverse magnetic stirrer agitation with maximum rotation speed of 1200 rpm. Etch rates with the etchants were determined from sheet resistance measurements. A plot of the etch rate of Cu as a function of molar concentration of alanine in the etchant is shown in FIG. 6.

Etchant E

An etchant was prepared containing the following: 0.05 M alanine, 1.0 M hydrogen peroxide, 0.02 M phosphate buffer, and 0.05 wt % CDTA at room temperature. Cu electroplated 4×4 cm samples were held in RDE with rotation at 100 rpm. Etch rates with the etchant were determined from sheet resistance measurements. A plot of the etch rate of copper as a function of pH, i.e., about 6 to about 8, using the etchant is shown in FIG. 7.

Etchant F

Figure 8:
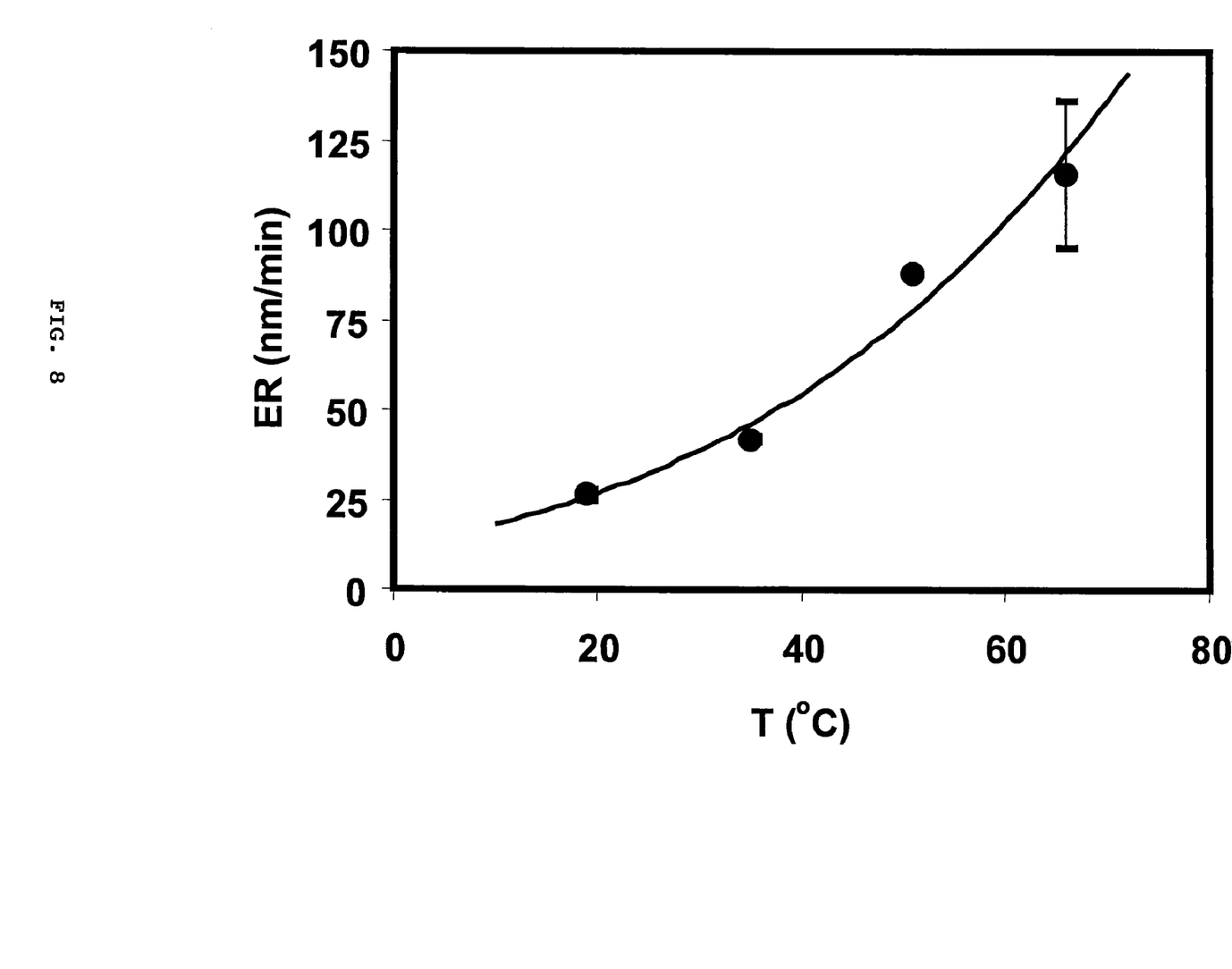
FIG. 8 illustrates a plot of the etch rate of copper as a function of temperature.

An etchant was prepared containing the following: 0.05 M alanine, 1.0 M hydrogen peroxide, 0.02 M phosphate buffer at pH 7 and 0.05% CDTA. Vapor deposited Cu and annealed, electroplated Cu samples were etched in the etchant with magnetic stirrer agitation at 300 and 770 rpm. Etch rates with the etchant were determined from sheet resistance measurements. A plot of the etch rate of Cu as a function of temperature, i.e., about 0° C. to about 70° C., with the etchant is shown in FIG. 8. Error bars indicate range of etch rates with vapor deposited and electroplated Cu, and with magnetic stirrer agitation.

Figure 9:
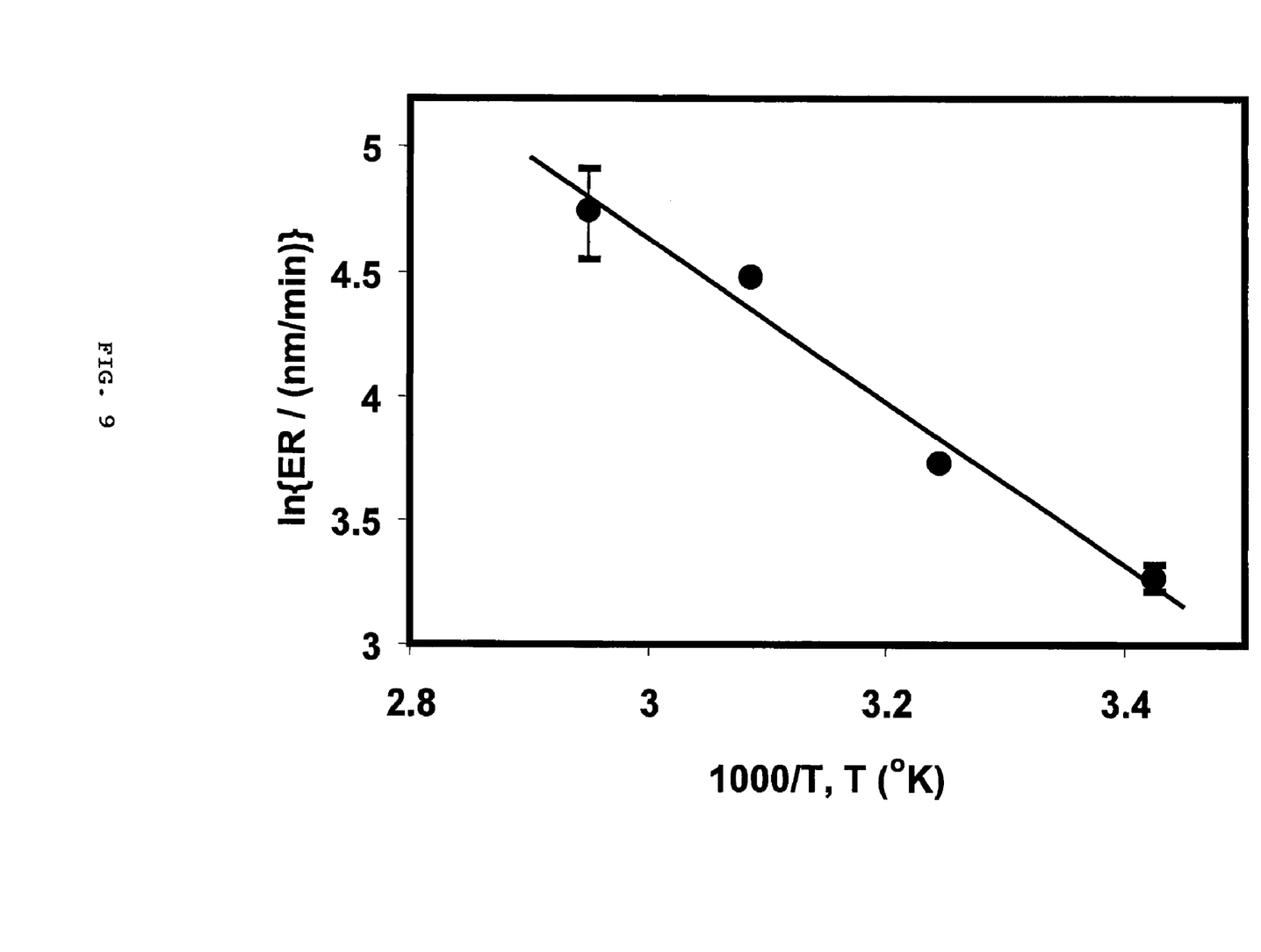
FIG. 9 illustrates an Arrhenius plot of copper etch rate with the etchant, samples, and agitation provided in FIG. 8.

FIG. 9 shows an Arrhenius plot of Cu etch rate with the etchant, samples, and agitation given in FIG. 8.

Other examples of etching compositions employed by the disclosure include but are not limited to the following: an etchant containing a molar concentration of 0.05 M alanine, 0.02 M phosphate buffer at pH 7, 3 wt % hydrogen peroxide, and 0.05 wt % CDTA; and an etchant containing a molar concentration of 0.05 M glycine, 0.05 M phosphate buffer at pH 7, and 3 wt % hydrogen peroxide.

An advantage of the above etchants is their minimal reactivity toward dielectrics, due to their near-neutral pH. Preventing attack on dielectrics is becoming more critical as the use of low-k, often porous dielectrics continues to expand.

It is noted that the component concentrations and operating temperature are selected so that contacting of the copper or copper alloy with the composition results in uniform, isotropic etching at a desired rate. In particular, the component concentrations and operating temperature may be selected, so that the thickness of the copper or copper alloy removed by the etchants may range from about 5 to about 1000 nm at a desired rate.

As shown in the plot in FIG. 3, the Cu depth increases linearly with etch time on all features measured. The Cu etch rate of each feature, as given by the slope of the best-fit line, is 46 nm/min in this case and it is independent of feature size, indicating that the etching process is dominated by the kinetics of surface reaction(s). The results shown in FIGS. 1 through 4 were obtained at room temperature (21±2° C.). For faster etch rates, higher temperatures may be selected, as shown in FIG. 8.

In the case of alanine, it is found that the average activation energy in the temperature range of about 19 to 66° C. is 27.3 kJ/mole, corresponding to an increase of about 40% in etch rate for every 10° C. Alternatively, a higher concentration of complexant may be used. For example, for alanine it is observed that the etch rate up to an alanine concentration of 200 mM, see FIG. 6, which conforms to the following formula:

$$ER = ER_0 + b[\text{alanine}]^n \qquad \text{(eq. 5)}$$

Here, $ER_0 = 1.5$ nm/min, $n = \frac{2}{3}$, and $b = 2.95$ nm/min/$(MM)^{2/3}$. If only a small thickness of Cu needs to be removed (e.g., about 5 to about 10 nm), having a total time of exposure to the etching solution of only a few seconds may pose process control problems.

In such a case, one may choose to use an amino acid with larger molecular volume (e.g., norvaline), to stay with a small molecular volume reagent such as alanine but operate below room temperature, and/or to decrease the complexant concentration. At very low complexant concentrations, however (in the case of alanine—at $\leq 20$ mM), a stable oxidized layer was observed to remain on the Cu surface; this layer is easily removed by rinsing with a dilute non-oxidizing acid such as acetic acid, but the extra step may not be desirable from a process perspective.

Obviously, numerous modifications and variations are possible in light of the above disclosure. It is therefore understood that within the scope of the appended claims, the disclosure may be practiced otherwise than as specifically described herein. Accordingly, the above disclosure should be regarded as illustrative in nature and not as restrictive. All publications and patents cited in the above disclosure are herein incorporated by reference.

What is claimed is:

1. An etching composition consisting essentially of:
   (a) one or more bidentate or tridentate copper complexants selected from the group consisting of aminocarboxylic acids (amino acids), aminophosphonic acids, di- and tricarboxylic acids, di- and triphosphonic acids, carboxyphosphonic acids, and combinations thereof;
   (b) a compound containing one or more peroxy groups;
   (c) one or more buffering compounds;
   (d) a peroxide stabilizer; and
   (e) water.

2. The etching composition according to claim 1, wherein a pH of the etching composition ranges from about 6 to about 8.

3. The etching composition according to claim 1, wherein the aminocarboxylic acids are alpha-aminoacids.

4. The etching composition according to claim 1, wherein the di- and tricarboxylic acids comprise malonic acid, citric acid, or a combination thereof.

5. The copper etching solution of claim 1, wherein the di- and triphosphonic acids comprise hydroxyethylidene-1,1-diphosphonic acid (HEDP).

6. The copper etching solution of claim 1, wherein a molar concentration of the complexants ranges about 0.01 to about 0.5 M.

7. The etching composition according to claim 1, wherein the compound containing peroxy groups is selected from the group consisting of hydrogen peroxide, perborate salts, percarbonate salts, an urea-hydrogen peroxide complex, and combinations thereof.

8. The etching composition according to claim 1, wherein a concentration of the compound containing peroxy groups ranges from about 0.02 M to about 4 M.

9. The etching composition according to claim 1, wherein the compound containing peroxy groups is hydrogen peroxide.

10. The etching composition according to claim 1, wherein the peroxide stabilizer comprises CDTA (cyclohexanediaminetetraacetic acid).

11. The etching composition according to claim 1, wherein the peroxide stabilizer comprises DTPMP (diethylenetriaminepenta(methylenephosphonic) acid).

12. The etching composition according to claim 1, wherein a pH of the etching composition ranges from about 5 to about 9.

13. The etching composition according to claim 12, wherein the alpha-amino acids are selected from the group consisting of glycine, alanine, norvaline, valine, 2-aminobutyric acid, and combinations thereof.

14. The etching composition according to claim 1, wherein the buffering compounds are selected from the group consisting of potassium dihydrogen phosphate, dipotassium hydrogen phosphate, phosphoric acid, potassium hydroxide or carbonate, and combinations thereof.

15. The etching composition according to claim 14, wherein a molar concentration of total phosphate ranges from about 0.005 to about 0.1 M.

16. An etching composition comprising:
    (a) one or more bidentate or tridentate copper complexants selected from the group consisting of aminocarboxylic acids (amino acids), aminophosphonic acids, di- and tricarboxylic acids, di- and triphosphonic acids, carboxyphosphonic acids, and combinations thereof;
    (b) a compound containing one or more peroxy groups;
    (c) one or more buffering compounds;
    (d) a peroxide stabilizer; and
    (e) water
    wherein the peroxide stabilizer comprises a compound selected from the group consisting of CDTA (cyclohexanediaminetetraacetic acid) and DTPMP (diethylenetriaminepenta(methylenephosphonic) acid).

17. A process of kinetically controlled etching of copper or copper alloys comprising:
    (a) preparing an etching composition according to claim 1;
    (b) exposing a copper or copper alloy containing substrate to the composition at a temperature between about 0° C. to about 70° C., with optional stirring or flow, to remove the copper or copper alloy;
    (c) removing the substrate when the copper or copper alloy has been dissolved;
    (d) rinsing the substrate with deionized water and/or an alcohol; and
    (e) drying in a stream of inert gas.

18. The process according to claim 17, wherein a thickness of the copper or copper alloys removed ranges from about 5 to about 1000 nm.

19. The process according to claim 17, wherein the etching composition is buffered to a pH in the range of about 5 to about 9 to form a surface-kinetic-limited etch to remove the copper or copper alloys.

20. The process according to claim 17, wherein an etch rate for removing the copper or copper alloys ranges from about 10 nm/min to about 200 nm/min.

21. A process for generating copper or copper alloy electrical interconnects or contact pads, which comprises:
    (a) depositing a blanket copper or copper alloy film on a dielectric substrate;
    (b) depositing a thin film of photoresist over the copper or copper alloy film;
    (c) exposing and developing the photoresist through a mask designed to generate the negative image of the desired copper or copper alloy pattern;
    (d) etching away the copper or copper alloy exposed in (c) with the etching composition according to claim 11; and
    (e) stripping the resist to reveal a desired copper or copper alloy pattern.

* * * * *